(12) United States Patent
Kitada et al.

(10) Patent No.: US 10,626,311 B2
(45) Date of Patent: Apr. 21, 2020

(54) CURABLE THERMALLY CONDUCTIVE GREASE, HEAT DISSIPATION STRUCTURE, AND METHOD FOR PRODUCING HEAT DISSIPATION STRUCTURE

(71) Applicant: POLYMATECH JAPAN CO., LTD., Saitama, Saitama (JP)

(72) Inventors: Gaku Kitada, Saitama (JP); Yasuyoshi Watanabe, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 116 days.

(21) Appl. No.: 15/103,426

(22) PCT Filed: Dec. 18, 2013

(86) PCT No.: PCT/JP2013/083965
§ 371 (c)(1),
(2) Date: Jun. 10, 2016

(87) PCT Pub. No.: WO2015/092889
PCT Pub. Date: Jun. 25, 2015

(65) Prior Publication Data
US 2016/0312097 A1 Oct. 27, 2016

(51) Int. Cl.
*C09K 5/08* (2006.01)
*H01L 23/373* (2006.01)
(Continued)

(52) U.S. Cl.
CPC .............. *C09K 5/08* (2013.01); *C08K 3/22* (2013.01); *C08K 3/28* (2013.01); *C08L 83/04* (2013.01);
(Continued)

(58) Field of Classification Search
CPC ............ C10N 2250/10; C10N 2210/03; C10N 2220/082; C10N 2230/08; C10N 2240/20;
(Continued)

(56) References Cited

U.S. PATENT DOCUMENTS

2002/0014692 A1* 2/2002 Yamada .................. C08K 3/08
257/712
2007/0031684 A1* 2/2007 Anderson ................ C09K 5/14
428/447
(Continued)

FOREIGN PATENT DOCUMENTS

JP 2006-332126 A 12/2006
JP 2009-138036 A 12/2007
(Continued)

OTHER PUBLICATIONS

International Search Report for PCT Patent App. No. PCT/JP2013/083965 (dated Apr. 1, 2014) with English translation thereof.

*Primary Examiner* — James C Goloboy
(74) *Attorney, Agent, or Firm* — Cermak Nakajima & McGowan LLP; Tomoko Nakajima (57) ABSTRACT

A curable thermally conductive grease 1a contains a curable liquid polymer, a thermally conductive filler (A) having an average particle diameter of less than 10 μm, and a thermally conductive filler (B) having an average particle diameter of 10 μm or more, the ratio by volume of the thermally conductive filler (A) to the thermally conductive filler (B), i.e., (A)/(B), being 0.65 to 3.02, and the curable thermally conductive grease having a viscosity of 700 Pa·s to 2070 Pa·s, in which after the curable thermally conductive grease is applied to the heat-generating body or the heat-dissipating body to a thickness of 5 mm, the curable thermally conductive grease has slump resistance in which the curable thermally conductive grease does not flow down when the (Continued)

heat-generating body or the heat-dissipating body is vertically arranged.

20 Claims, 1 Drawing Sheet (51) Int. Cl.
| | |
|---|---|
| C08L 101/00 | (2006.01) |
| C08L 83/04 | (2006.01) |
| H01L 23/42 | (2006.01) |
| C10M 169/02 | (2006.01) |
| C10M 171/02 | (2006.01) |
| C08K 3/22 | (2006.01) |
| C08K 3/28 | (2006.01) |
| H01L 21/48 | (2006.01) |
| C08G 77/20 | (2006.01) |
| C08G 77/12 | (2006.01) |
| H01L 23/40 | (2006.01) |

(52) U.S. Cl.
CPC ......... *C08L 101/00* (2013.01); *C10M 169/02* (2013.01); *C10M 171/02* (2013.01); *H01L 21/4871* (2013.01); *H01L 23/3737* (2013.01); *H01L 23/42* (2013.01); *C08G 77/12* (2013.01); *C08G 77/20* (2013.01); *C08K 2003/2227* (2013.01); *C08K 2201/001* (2013.01); *C10M 2201/0626* (2013.01); *C10M 2229/0435* (2013.01); *C10N 2210/03* (2013.01); *C10N 2220/082* (2013.01); *C10N 2230/08* (2013.01); *C10N 2240/20* (2013.01); *C10N 2250/10* (2013.01); *H01L 23/4006* (2013.01); *H01L 2924/0002* (2013.01); *Y02P 20/582* (2015.11)

(58) Field of Classification Search
CPC ..... C09K 5/08; C10M 169/02; C10M 171/02; C10M 2201/0626; C10M 2229/0435; C08G 77/12; C08G 77/20; C08K 3/22; C08K 3/28; C08K 2201/001; C08K 2003/2227; C08L 83/04; C08L 101/00; H01L 21/4871; H01L 23/3737; H01L 23/4406; H01L 2924/002; Y02P 20/582
USPC .......................................................... 257/702
See application file for complete search history.

(56) References Cited

U.S. PATENT DOCUMENTS

| | | | |
|---|---|---|---|
| 2010/0075135 A1* | 3/2010 | Kendall | C08K 3/20 428/323 |
| 2010/0197533 A1* | 8/2010 | Kendall | C10M 113/00 508/103 |
| 2011/0188213 A1* | 8/2011 | Domae | C08L 83/04 361/748 |

FOREIGN PATENT DOCUMENTS

| | | |
|---|---|---|
| JP | 2009-286855 A | 12/2009 |
| JP | 2011-088953 A | 5/2011 |
| JP | 2011-246536 A | 12/2011 |
| JP | 2012-107152 A | 6/2012 |

* cited by examiner

CURABLE THERMALLY CONDUCTIVE GREASE, HEAT DISSIPATION STRUCTURE, AND METHOD FOR PRODUCING HEAT DISSIPATION STRUCTURE

This application is a national phase entry under 35 U.S.C. § 371 of and claims priority under 35 U.S.C. § 119 to PCT Patent Application No. PCT/JP2013/083965, filed on Dec. 18, 2013, which is incorporated by reference.

TECHNICAL FIELD

The present invention relates to a curable thermally conductive grease arranged between a heat-generating body and a heat-dissipating body, and in particular, to a curable thermally conductive grease that reliably enables the filling of a gap between the heat-generating body and the heat-dissipating body even if the gap is wide, and a heat dissipation structure including the grease.

BACKGROUND ART

To dissipate heat generated from heat-generating bodies, such as semiconductor elements and machine parts, heat-dissipating bodies, such as heat sinks, are used. For the purpose of efficiently conducting heat, thermally conductive greases can be applied between heat-generating bodies and heat-dissipating bodies.

Thermally conductive greases have lower thermal conductivity than those of heat-generating bodies and heat-dissipating bodies (typically composed of metals) and thus are advantageously applied in the form of thinner films. In order not to form an air layer, which has significantly low thermal conductivity, between heat-generating bodies and heat-dissipating bodies, low-viscosity, high-fluidity thermally conductive greases are advantageous. For these reasons, in the case where gaps between heat-generating bodies and heat-dissipating bodies are narrow, low-viscosity thermally conductive greases have been suitably used.

In recent years, however, elements that generate heat have been increasing, and the total amount of heat generated have been prone to increase. Thus, heat is preferably dissipated from a plurality of electronic elements or from the entire substrate, rather than a specific electronic element. In these circumstances, various structures are used to dissipate heat. For example, heat-dissipating bodies can be mounted on different-height electronic elements, from which heat is to be dissipated and on heat-generating bodies arranged obliquely or transversely.

When an attempt is made to use a conventional thermally conductive grease in order to meet such demands, the grease cannot maintain an applied state and disadvantageously flows out because of its low viscosity. Thus, a thermally conductive grease with higher thixotropic properties has been developed and described in, for example, Japanese Unexamined Patent Application Publication No. 2011-088953 (Patent Literature 1).

In the case where a gap between a heat-generating body and a heat-dissipating body is wide, a heat-dissipating sheet as described in, for example, Japanese Unexamined Patent Application Publication No. 2006-332126 (Patent Literature 2) is conceivably used. Examples of the use of such a heat-dissipating sheet include the use of heat-dissipating sheets corresponding to different-height heat-generating bodies; the use of a soft heat-dissipating sheet; and the use of a heat-dissipating sheet with a hole corresponding to a portion of the heat-dissipating sheet to be brought into contact with a heat-generating body with large height.

CITATION LIST

Patent Literature

PTL 1: Japanese Unexamined Patent Application Publication No. 2011-088953
PTL 2: Japanese Unexamined Patent Application Publication No. 2006-332126

SUMMARY OF INVENTION

Technical Problem

In the case of the thermally conductive grease having thixotropic properties described in Japanese Unexamined Patent Application Publication No. 2011-088953 (Patent Literature 1), when a heat-dissipating body is in close contact with a heat-generating body, the slump of the thermally conductive grease is inhibited. However, in the case where a gap between a heat-generating body and a heat-dissipating body is wide and where the thermally conductive grease is applied in the form of a thick film, the thickness of the thermally conductive grease applied is not maintained. Furthermore, when the thermally conductive grease is applied to a heat-generating body arranged obliquely or transversely, the thermally conductive grease flows out before a heat-dissipating body is mounted and cannot be used.

In the method of using such a heat-dissipating sheet as described in Japanese Unexamined Patent Application Publication No. 2006-332126 (Patent Literature 2), in the case where heat-dissipating sheets corresponding to heat-generating bodies with different heights are prepared, the plural heat-dissipating sheets need to be bonded to the respective portions. This disadvantageously increases the number of steps. The use of a soft heat-dissipating sheet can disadvantageously cause stress concentration to occur at a specific portion of a substrate because of different stresses at portions with different compression ratios. The use of a heat-dissipating sheet in which a hole is formed can disadvantageously cause a reduction in thermal conductivity at a portion where the hole is formed.

It is an object of the present invention to provide a technique for efficiently transferring heat emitted from a heat-generating body to a heat-dissipating body even in the case of a structure with a wide gap between the heat-generating body and the heat-dissipating body, in which none of conventional thermally conductive greases do not cope with the structure and in which the use of a heat-dissipating sheet for this structure can cause a problem.

Solution to Problem

To achieve the foregoing object, there is provided a curable thermally conductive grease that is provided between a heat-generating body, for example, a semiconductor element or a machine part, and a heat-dissipating body configured to dissipate heat generated from the heat-generating body to facilitate heat transfer from the heat-generating body to the heat-dissipating body, the curable thermally conductive grease including a curable liquid polymer, a thermally conductive filler (A) having an average particle diameter less than 10 μm, and a thermally conductive filler (B) having an average particle diameter of 10 μm or more, the ratio by volume of the thermally conductive filler (A) to the thermally conductive filler (B), i.e., (A)/(B), being 0.65 to 3.02, and the curable thermally conductive grease having a viscosity of 700 Pa·s to 2070 Pa·s, in which after the curable thermally conductive grease is applied to the heat-generating body or the heat-dissipating body to a thickness of 5 mm, the curable thermally conductive grease has slump resistance in which the curable thermally conductive grease does not flow down when the heat-generating body or the heat-dissipating body is vertically arranged.

The curable thermally conductive grease is provided between the heat-generating body, for example, a semiconductor element or a machine part, and the heat-dissipating body configured to dissipate heat generated from the heat-generating body to facilitate heat transfer from the heat-generating body to the heat-dissipating body. Thus, heat dissipation is suitably performed without causing a problem when a heat-dissipating sheet is used.

The use of the curable liquid polymer prevents the application of an excessive compressive stress to the heat-generating body and the heat-dissipating body during assembling. After curing, slumping and sliding down are less likely to occur.

The curable thermally conductive grease contains the thermally conductive filler (A) having an average particle diameter less than 10 μm and the thermally conductive filler (B) having an average particle diameter of 10 μm or more, the ratio by volume of the thermally conductive filler (A) to the thermally conductive filler (B), i.e., (A)/(B), being 0.65 to 3.02. Thus, after the application of the curable thermally conductive grease to the heat-dissipating body or the heat-generating body, the curable thermally conductive grease is held with the application state maintained. Furthermore, the curable thermally conductive grease has suitable thermal conductivity.

The curable thermally conductive grease has a viscosity of 700 Pa·s to 2070 Pa·s. Thus, slumping is less likely to occur after the application. Furthermore, the application may be performed with a dispenser. In addition, after the application of the curable thermally conductive grease to the heat-dissipating body or the heat-generating body, the curable thermally conductive grease is held with the application state maintained.

The curable thermally conductive grease may have a hardness of E 70 or less after curing in terms of hardness E specified in JIS K6253. The hardness after curing is E 70 or less in terms of hardness E specified in JIS K6253. Hence, if a vibration and an impact from the outside are applied, the curable thermally conductive grease follows variations of the heat-generating body and the heat-dissipating body. Thus, a defect, such as peeling, is less likely to occur.

There is provided a heat dissipation structure for an electronic device, comprising a heat-generating body, for example, a semiconductor element or a machine part, a heat-dissipating body configured to dissipate heat generated from the heat-generating body, and a curable thermally conductive grease that is provided between the heat-generating body and the heat-dissipating body to facilitate heat transfer from the heat-generating body to the heat-dissipating body, in which the curable thermally conductive grease that fills a gap between the heat-generating body and the heat-dissipating body has a thickness of more than 1 mm and 10 mm or less, and the heat-generating body or the heat-dissipating body is subjected to a compressive stress of 1.0 N/cm$^2$ or less from the curable thermally conductive grease.

The curable thermally conductive grease that fills a gap between the heat-generating body and the heat-dissipating body has a thickness of more than 1 mm and 10 mm or less. Thus, even if the gap between the heat-generating body and the heat-dissipating body is as large as more than 1 mm and 10 mm or less, the curable thermally conductive grease can be used. Furthermore, in the case where a plurality of heat-generating bodies and a plurality of heat-dissipating bodies are present and where they are irregularly spaced, the curable thermally conductive grease can also be suitably used.

The heat-generating body or the heat-dissipating body is subjected to a compressive stress of 1.0 N/cm$^2$ or less from the curable thermally conductive grease, thereby reducing loads on the heat-generating body and the heat-dissipating body. It is thus possible to prevent the occurrence of strain in the heat-generating body, the heat-dissipating body, a substrate, and so forth.

In the electronic device including the heat-generating body, the heat-generating body may be obliquely arranged with respect to the electronic device. In the electronic device including the heat-generating body, even if the heat-generating body is obliquely mounted, in other words, even if an object to which the curable thermally conductive grease is to be applied is out of level, the state of the curable thermally conductive grease at the time of application is maintained. Thus, the heat-dissipating body is reliably mounted on the heat-generating body.

There is provided a method for producing a heat dissipation structure for an electronic device, the heat dissipation structure including a heat-generating body, for example, a semiconductor element or a machine part, a heat-dissipating body configured to dissipate heat generated from the heat-generating body, and a curable thermally conductive grease that is provided between the heat-generating body and the heat-dissipating body to facilitate heat transfer from the heat-generating body to the heat-dissipating body, the method including, in sequence, applying the curable thermally conductive grease to the heat-generating body or the heat-dissipating body in such a manner that the curable thermally conductive grease provided between the heat-generating body and the heat-dissipating body has a set thickness of more than 1 mm and 10 mm or less and that the curable thermally conductive grease before curing has a larger thickness than the set thickness, pressing the applied curable thermally conductive grease to the set thickness to assemble the heat-generating body and the heat-dissipating body, and curing the curable thermally conductive grease.

When the curable thermally conductive grease is applied to a set thickness of more than 1 mm and 10 mm or less, the application state is maintained. Thus, after the curable thermally conductive grease is applied to a larger thickness than the set thickness, the curable thermally conductive grease may be pressed to the set thickness. The pressing of the curable thermally conductive grease having a larger thickness than the set thickness inhibits the inclusion of a bubble or the formation of a gap between the heat-dissipating body and the heat-generating body. Thus, even in the case of a wide gap between the heat-generating body and the heat-dissipating body, the gap is reliably filled. After the curable thermally conductive grease is pressed to the set thickness in a state of being uncured, the curable thermally conductive grease is cured. Thus, the heat-dissipating body, the heat-generating body, and a substrate are less likely to be subjected to compressive stresses. This results in the heat dissipation structure free from a stress concentration problem due to pressing.

Advantageous Effects of Invention

According to the present invention, even in the case of a wide gap between the heat-generating body and the heat-dissipating body, the gap is reliably filled, thereby effectively dissipating heat. Furthermore, such a structure is provided.

According to the present invention, a stress concentration problem due to pressing does not arises in the heat-generating body or the heat-dissipating body, and heat is effectively dissipated. Furthermore, such a structure is provided.

BRIEF DESCRIPTION OF DRAWINGS

FIG. 2 is an explanatory drawing illustrating a state after a slump test.

DESCRIPTION OF EMBODIMENTS

Figure 1:
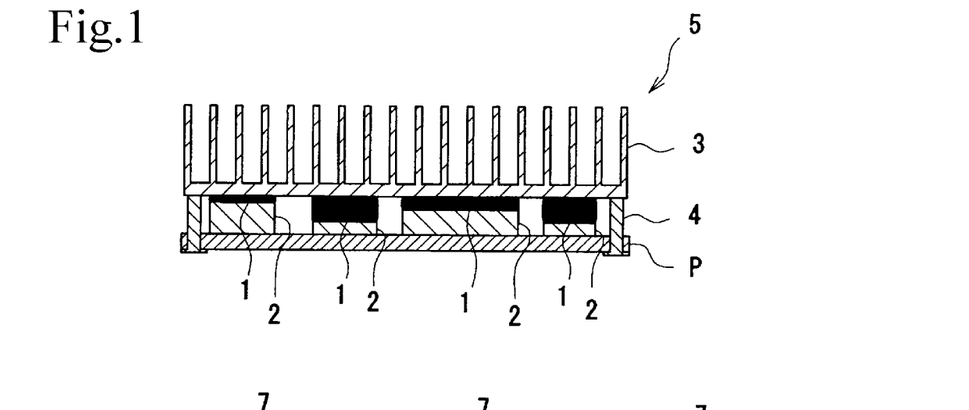
FIG. 1 is an explanatory cross-sectional view of a heat dissipation structure illustrating a state of use of a curable thermally conductive grease.

A curable thermally conductive grease 1 according to this embodiment will be described below. As illustrated in FIG. 1, the curable thermally conductive grease 1 is provided between a plurality of heat-generating bodies 2 arranged on a substrate P and a heat-dissipating body 3 which faces the heat-generating bodies 2 and which is spaced relatively further from the heat-generating bodies 2 and serves to transfer heat from the heat-generating bodies 2 to the heat-dissipating body 3.

The curable thermally conductive grease contains a curable liquid polymer, a thermally conductive filler (A) having an average particle diameter less than 10 µm, and a thermally conductive filler (B) having an average particle diameter of 10 µm or more. The ratio by volume of the thermally conductive filler (A) to the thermally conductive filler (B), i.e., (A)/(B), is 0.65 to 3.02. The curable thermally conductive grease has a viscosity of 700 Pa·s to 2070 Pa·s.

The curable thermally conductive grease may be suitably used in the form of a thick film. More specifically, the curable thermally conductive grease may be used to an electronic device in which some heat-generating bodies and the heat-dissipating body are arranged with a gap provided therebetween at intervals of at least more than 1 mm. The gap is typically in the range of 3 mm to 8 mm and preferably 2 mm to 10 mm. A gap of more than 10 mm can fail to maintain the form of the curable thermally conductive grease at the time of application when the heat-dissipating body is mounted on the heat-generating bodies.

A conventionally common gap between the heat-generating bodies and the heat-dissipating body is 1 mm or less, typically 5 µm to 400 µm. The curable thermally conductive grease may also be used even for the small gap. A conventional thermally conductive grease is based on the precondition that it is applied in a thin layer. If such a conventional thermally conductive grease is applied to a thickness of more than 1 mm, the grease flows and fails to maintain the thickness.

For use in the form of a thick film, the curable thermally conductive grease has slump resistance such that when a predetermined slump test is performed, no problem arises.

The outline of the slump test and categories of the test results will be described below.

Curable thermally conductive greases are each applied to a surface-untreated aluminum sheet 6 with a thickness of 10 µm so as to have dimensions of 30 mm×30 mm×5 mm in thickness, thereby producing test pieces 7. After the test pieces 7 are allowed to stand vertically at an ambient temperature of 23° C. for 60 minutes, the states of the test pieces 7 are observed. The observation results are classified into three categories illustrated in FIG. 2.

Figure 2A:
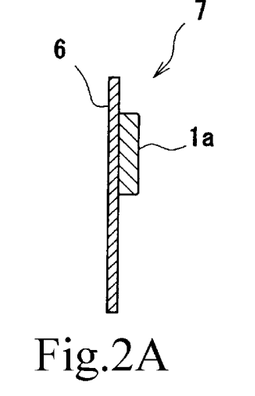
FIG. 2(A) illustrates state (1).

State (1): a state in which a curable thermally conductive grease 1a remains unchanged and maintains the initial state at the time of application (FIG. 2(A)).

Figures 2B, 2C:
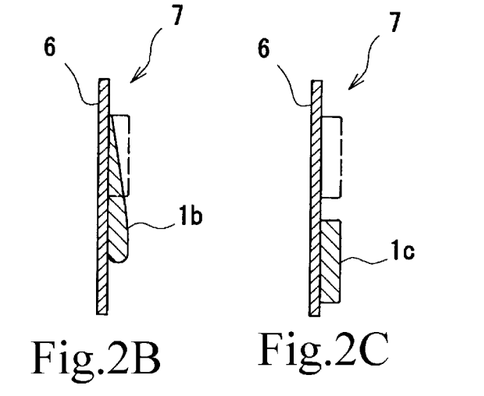
FIG. 2(B) illustrates state (2).
FIG. 2(C) illustrates state (3).

State (2): a state in which a curable thermally conductive grease 1b flows down (FIG. 2(B)).

State (3): a state in which although the form of a curable thermally conductive grease 1c applied is maintained as a whole, the curable thermally conductive grease 1c slides down with the form maintained (FIG. 2(C)).

Among these three states, state (1) is a problem-free state in which the curable thermally conductive grease should be provided.

A material used for the curable thermally conductive grease will be described below.

As the liquid polymer, a curable liquid polymer with a viscosity of about 0.05 Pa·s to about 2 Pa·s may be used. A liquid polymer with a viscosity of less than 0.05 Pa·s has a low molecular weight and is not easily increased in molecular weight even after curing, so that the cured body of the curable thermally conductive grease can be brittle. At a viscosity of more than 2 Pa·s, the viscosity of the curable thermally conductive grease easily increases. Thus, when the curable thermally conductive grease has a desired viscosity range, the amount of a thermally conductive filler added is low, the maintenance performance of the initial form of the grease applied can be degraded.

The curable liquid polymer includes a liquid polymer that can be cured by heating the liquid polymer itself or by photoirradiation; and a liquid polymer that can be cured by the addition of a curing agent other than the liquid polymer. Both of the main agent and the curing agent may be liquid polymers.

In particular, the curable liquid polymer is preferably an addition reaction-curable liquid polymer because the addition reaction-curable liquid polymer has a low cure shrinkage. More specifically, when the curable thermally conductive grease is cured while the grease is held between the heat-generating bodies and the heat-dissipating body, a high cure shrinkage can result in the formation of a gap between the grease and a corresponding one of the heat-generating bodies or between the grease and the heat-dissipating body. In the case of the addition reaction-curable liquid polymer, a problem in which a gap is formed is less likely to arise because of its low cure shrinkage. Examples of the addition reaction-curable liquid polymer include olefin polymers, such as polyurethane, epoxy resins, and poly-α-olefins; and organopolysiloxanes. Of these, an organopolysiloxane which is particularly soft and which has good filling properties of the thermally conductive filler is preferably used.

Examples of the thermally conductive fillers (A) and (B) (the thermally conductive fillers (A) and (B) are also referred to collectively as a "thermally conductive filler") include spherical or scale-like powders of metals, metal oxides, metal nitrides, metal carbides, and metal hydroxides; and carbon fibers. Examples of metals include aluminum, copper, and nickel. Examples of metal oxides include aluminum oxide, magnesium oxide, zinc oxide, and quartz. Examples of metal nitrides include boron nitride and aluminum nitride. An example of metal carbides is silicon carbide. An example of metal hydroxides is aluminum hydroxide. Examples of carbon fibers include pitch-based carbon fibers, PAN-based carbon fibers, fibers formed by subjecting resin fibers to carbonization treatment, and fibers formed by subjecting resin fibers to graphitization treatment. Among these, for applications that require insulating properties, a powder of a metal oxide, a metal nitride, a metal carbide, or a metal hydroxide is preferably used.

The thermally conductive filler is preferably composed of a material with low specific gravity. More specifically, a material with a specific gravity of 4.0 or less is preferably used. Examples of the material with a specific gravity of 4.0 or less include aluminum, aluminum oxide, magnesium oxide, quartz, boron nitride, aluminum nitride, silicon carbide, aluminum hydroxide, and carbon fibers. A material with a specific gravity of 3.0 or less is more preferred. Examples of the material with a specific gravity of 3.0 or less include aluminum, aluminum hydroxide, quartz, and carbon fibers. The reason for this is that the use of a thermally conductive filler with lower specific gravity enhances slump resistance, compared with the case where a filler with high specific gravity is used.

The thermally conductive filler can be divided into the thermally conductive filler (A) having an average particle diameter of less than 10 μm and the thermally conductive filler (B) having an average particle diameter of 10 μm or more. The ratio by volume of these two fillers, i.e., (A)/(B), is in the range of 0.65 to 3.02. Within the predetermined range, the amounts added are adjusted to set the viscosity of the curable thermally conductive grease to the predetermined range, thereby resulting in high slump resistance. When the ratio by volume of the thermally conductive fillers, i.e., (A)/(B), is less than 0.65, the slide down illustrated by state (3) occurs easily, thereby causing difficulty in maintaining the state at the time of application. At a ratio by volume of more than 3.02, it is difficult to increase the thermal conductivity.

When the total amount (weight) of the two thermally conductive fillers (A) and (B) added is constant, a higher proportion of the thermally conductive filler (B) having a large particle diameter results in lower flowability of the curable thermally conductive grease, and a surface of the grease is noticeably rough. Although the form of the curable thermally conductive grease is easily maintained even in an uncured state, the slide down state as illustrated in state (3) is liable to occur in the slump test. The reason for this is presumably as follows: from the fact that the curable thermally conductive grease has a rough surface, the amount of the thermally conductive filler exposed at the surface is increased to reduce the adhesion of the liquid polymer resulting from surface tension. From the viewpoint of increasing the thermal conductivity of the curable thermally conductive grease, the proportion of the thermally conductive filler having a large particle diameter is preferably increased.

The curable thermally conductive grease has a viscosity of 700 Pa·s to 2070 Pa·s. A viscosity of less than 700 Pa·s results in high flowability, so that the flowing down state as illustrated in state (2) is liable to occur in the slump test. From the viewpoint of slump resistance, the upper limit of the viscosity is not limited. At a viscosity of more than 2070 Pa·s, it is difficult to perform an application operation.

The thermally conductive filler (A) preferably has an average particle diameter of 0.3 μm to 5 μm. The reason for this is as follows: An average particle diameter of less than 0.3 μm results in unnecessarily high viscosity. Thus, charging is not sufficiently performed. At an average particle diameter of more than 5 μm, the thermally conductive filler (A) is less likely to be closely charged into gaps between large particles.

The thermally conductive filler (B) preferably has an average particle diameter of 30 μm to 100 μm. The reason for this is as follows: An average particle diameter of less than 30 μm does not result in sufficient thermal conductivity. At an average particle diameter of more than 100 μm, settling is liable to occur.

As the average particle diameter of the thermally conductive filler, a volume-average particle diameter in a particle size distribution measured by a laser diffraction/scattering method (JIS R1629) may be used. The viscosity may be measured with a viscometer (rotational viscometer DV-E, manufactured by BROOKFIELD) using spindle No. 14 attached to a rotor at a rotation speed of 1 rpm and a measured temperature of 23° C.

The thermally conductive filler (A) and the thermally conductive filler (B) may be composed of the same material or different materials as described below.

The thermally conductive filler (A) preferably contains aluminum hydroxide. The use of aluminum hydroxide reduces the specific gravity of the curable thermally conductive grease, thereby inhibiting the separation of the liquid polymer from the thermally conductive filler.

As the thermally conductive filler (B), aluminum oxide is preferably used. Aluminum oxide, in particular, has high thermal conductivity. The use of aluminum oxide as the thermally conductive filler (B) with a large particle diameter effectively enhances the thermal conductivity.

The thermally conductive filler (B) preferably has a spherical form. The reason for this is that the spherical form has a smaller specific surface area than those of other forms. Specifically, even if the proportion of the thermally conductive filler (B) with a large particle diameter is increased, the flowability of the curable thermally conductive grease is less likely to decrease owing to the small specific surface area. Furthermore, the surface roughness is reduced. Thus, the use of the spherical thermally conductive filler (B) effectively enhances the slump resistance.

The curable thermally conductive grease may contain various additives. For example, a dispersant, a flame retardant, a coupling agent, a plasticizer, a curing retarder, an antioxidant, a colorant, and a catalyst may be appropriately added thereto.

When the liquid polymer contains a thermally conductive filler and the additive, the curable thermally conductive grease is produced by mixing the additive.

Figure 3:
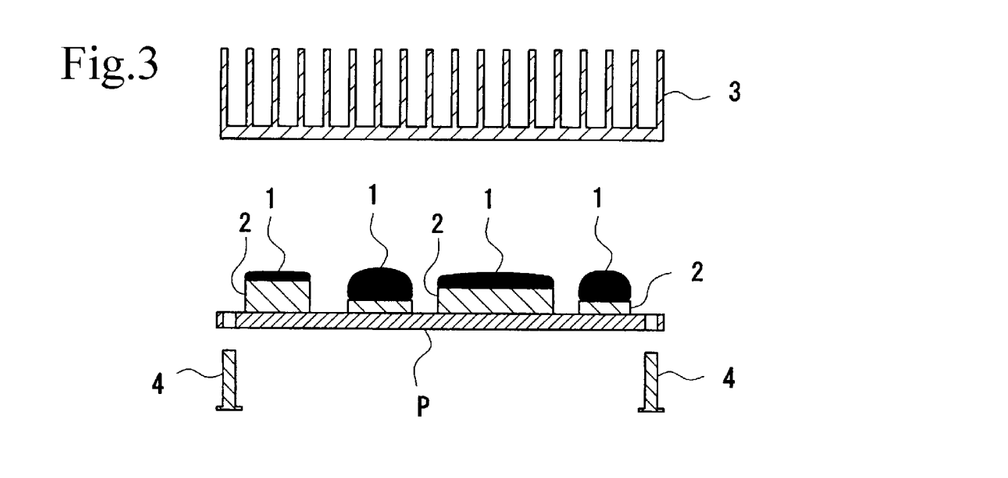
FIG. 3 is an explanatory cross-sectional view illustrating a method for applying a curable thermally conductive grease.

As illustrated in FIG. 3, the curable thermally conductive grease 1 is applied to a desired thickness on the heat-generating bodies 2. The heat-dissipating body 3 is mounted thereon. In this case, the heat-dissipating body 3 is mounted with mounting pins 4 in such a manner that a predetermined gap is provided between the heat-generating bodies 2 and the heat-dissipating body 3. Subsequently, the curable thermally conductive grease 1 is cured. Although the heat-generating bodies 2 and the heat-dissipating body 3 press the curable thermally conductive grease 1 during the mounting of the heat-dissipating body 3, no excessive pressure is applied to the heat-generating bodies 2 or the heat-dissipating body 3 because the curable thermally conductive grease 1 is not cured yet. The curing of the curable thermally conductive grease 1 results in the formation of a heat-dissipating path from the heat-generating bodies 2 to the heat-dissipating body 3 through the cured body of the curable thermally conductive grease 1.

The curable thermally conductive grease is preferably applied to a larger thickness than the gap when the heat-generating bodies and the heat-dissipating body are assembled into a final structure. For example, in the case of a gap of 2 mm, the application thickness is more than 2 mm. The reason for this is that after the grease is applied to a larger thickness than the gap of the final structure, the curable thermally conductive grease is pressed while the heat-dissipating body is mounted, thereby eliminating the formation of a gap between the heat-generating bodies 2 and the curable thermally conductive grease. The application thickness is preferably 110% to 150% of the length of the gap. An application thickness of less than 110% can partially form a gap because of variations in application thickness. An application thickness of more than 150% can cause the curable thermally conductive grease to protrude outward from the heat-generating bodies and the heat-dissipating body, thereby possibly increasing waste portions that do not contribute to heat transfer.

The curable thermally conductive grease may be applied by a method of application with a common dispenser. In particular, in a preferred embodiment, the application is performed using a dispenser with a curable thermally conductive grease such that a curable thermally conductive grease serving as a main agent and a curable thermally conductive grease serving as a curing agent are prepared and such that the two liquids are mixed together immediately before application. The reason for this is as follows: In this method, the two liquids are mixed together immediately before application; hence, curing is less likely to occur in an application step. In addition to easy storage, rapid curing may be performed after application. The method of the application of the curable thermally conductive grease is not limited to a method using the dispenser.

To cure the curable thermally conductive grease, curing means depending on the material of the curable thermally conductive grease may be employed. Examples of the curing means include curing by allowing the grease to stand at room temperature over a period of time; thermal curing; and ultraviolet curing.

The curable thermally conductive grease after curing (the cured body of the curable thermally conductive grease) may have a hardness of E 70 or less in terms of hardness E specified in JIS K6253.

In the case where the electronic device including the heat-dissipating bodies and the heat-dissipating body is mounted on a vehicle or a mobile apparatus, it is assumed that the electronic device is subjected to vibrations while the vehicle is moving and an impact due to a drop. When the curable thermally conductive grease has a hardness of more than E 70, the vibrations and the impact can cause the application of an excessive pressure on the substrate. Furthermore, the grease can peel off from the heat-generating bodies or the heat-dissipating body to form a gap. However, when the hardness is E 70 or less, the curable thermally conductive grease absorbs the vibrations and prevents the application of the excessive pressure on the substrate. Furthermore, the grease follows the variations of the heat-generating bodies and the heat-dissipating body and prevents the formation of a gap between the grease and a corresponding one of the heat-generating bodies or the heat-dissipating body.

The lower limit of the hardness is not particularly limited and is practically E 0 or more.

The adhesive strength of the cured body of the curable thermally conductive grease to each of the heat-generating bodies or the heat-dissipating body is preferably 3 N/cm$^2$ or more. The reason for this is as follows: at an adhesive strength of 3 N/cm$^2$ or more, the cured body is less likely to peel off even if subjected to vibrations or impacts, so that a gap is less likely to be formed.

The curable thermally conductive grease has a predetermined composition. Thus, when the grease is applied to a thickness of more than 1 mm and 10 mm or less, the grease maintains the application state without slumping or sliding down. Even in the case of a wide gap between the heat-generating bodies and the heat-dissipating body, the curable thermally conductive grease is provided between the heat-generating bodies and the heat-dissipating body.

In a heat dissipation structure 5 of an electronic device which is produced by the foregoing method and in which heat is suitably transferred from the heat-generating bodies to the heat-dissipating body, the heat-generating bodies or the heat-dissipating body is subjected to a compressive stress of 1.0 N/cm$^2$ or less from the curable thermally conductive grease, thereby reducing loads on the heat-generating bodies, the heat-dissipating body, and the substrate P. It is thus possible to prevent the occurrence of strain, in particular, in the substrate P.

In contrast, in the case of a conventionally common thermally conductive grease, the grease in the form of a liquid is applied to a thin layer. To prevent the grease from flowing to form a gap in the duration of use, a heat-generating body and a heat-dissipating body are in pressure contact with the grease at a load as high as 14 N/cm$^2$ to 70 N/cm$^2$. Even in the case of a heat-dissipating sheet, the heat-dissipating sheet is used in a compression state and is in pressure contact with a heat-generating body at a load of 6.9 N/cm$^2$ to 50 N/cm$^2$.

EXAMPLES

Preparation of Sample

Sample 1

One hundred parts by weight of a vinyl-terminated organopolysiloxane (base liquid silicone) (with a viscosity of 300 mPa·s at 25° C.) which was an addition reaction-curable liquid silicone and served as a liquid polymer, 140 parts by weight of an aluminum hydroxide powder having no definite form and having an average particle diameter of 1 μm, 200 parts by weight of spherical alumina having an average particle diameter of 3 μm, and 600 parts by weight of spherical alumina having an average particle diameter of 70 μm, which served as thermally conductive fillers, were mixed together to prepare a main agent for a curable thermally conductive grease. The same thermally conductive fillers as in the main agent were mixed with 100 parts by weight of organohydrogenpolysiloxane (liquid silicone curing agent) having a viscosity of 400 mPa·s in the same amounts as in the main agent to prepare a curing agent for the curable thermally conductive grease, the curing agent and the main agent being different only in the composition of the liquid polymer. The main agent and the curing agent were then mixed together to produce a curable thermally conductive grease of sample 1.

In the curable thermally conductive grease of sample 1, the ratio by volume of the small-particle-diameter thermally conductive filler (A) having an average particle diameter of less than 10 μm to the large-particle-diameter thermally conductive filler (B) having an average particle diameter of 10 μm or more, i.e., (A)/(B), was 0.713. The viscosity at 25° C. immediately after the mixing was 1500 Pa·s. After curing, the thermal conductivity was 3.1 W/m·K, and the specific gravity was 3.00.

The average particle diameters of the thermally conductive fillers were volume-average particle diameters in particle size distributions measured by a laser diffraction/ scattering method (JIS R1629). The viscosities were values measured with a viscometer (rotational viscometer DV-E, manufactured by BROOKFIELD) using spindle No. 14 attached to a rotor at a rotation speed of 1 rpm and a measured temperature of 23° C. The specific gravity was measured by an underwater substitution method specified in JIS K7311.

The mixing of the main agent and the curing agent was performed immediately before application to test pieces produced for tests described below.

Samples 2 to 11

Samples 2 to 11 were produced as in sample 1, except that the amounts of the thermally conductive fillers added were changed as listed in Tables 1 and 2.

Slump Resistance

The curable thermally conductive grease of each of the samples described above was applied to a surface-untreated aluminum sheet with a thickness of 10 μm so as to have dimensions of 30 mm×30 mm×5 mm in thickness, thereby producing test pieces. After the test pieces were allowed to stand vertically for 60 minutes, the states of the test pieces were observed. The ambient temperature was 23° C.

The states of the test pieces were classified into three categories as described below.

State (1): no change was observed, and the initial state was maintained.

State (2): the curable thermally conductive grease flowed down and slumped.

TABLE 1

|  |  |  | Sample 1 | Sample 2 | Sample 3 | Sample 4 | Sample 5 | Sample 6 |
|---|---|---|---|---|---|---|---|---|
| Composition | Liquid polymer | Base liquid silicone | 100 | 100 | 100 | 100 | 100 | 100 |
|  | Thermally conductive filler small particle diameter (A) | Aluminum hydroxide indefinite form, 1 μm | 140 | 119 | 140 | 180 | — | 100 |
|  |  | Alumina, indefinite form 1.6 μm | — | — | — | — | 180 | — |
|  |  | Alumina, spherical 3 μm | 200 | 170 | 200 | — | 200 | — |
|  |  | Aluminum hydroxide indefinite form, 8 μm | — | — | — | 155 | — | 200 |
|  | Thermally conductive filler large particle diameter (B) | Alumina, spherical 45 μm | — | — | — | — | 10 | — |
|  |  | Alumina, spherical 70 μm | 600 | 510 | 650 | 180 | 400 | — |
|  |  | Aluminum hydroxide indefinite form, 50 μm | — | — | — | — | — | 200 |
|  |  | Boron nitride aggregate, 60 μm | — | — | — | — | — | — |
| Ratio by volume of thermally conductive filler ((A)/(B)) |  |  | 0.713 | 0.713 | 0.658 | 3.02 | 0.842 | 1.50 |
| Viscosity (Pa · s) |  |  | 1500 | 860 | 1710 | 1660 | 2070 | 700 |
| Slump resistance |  |  | state (1) | state (1) | state (1) | state (1) | state (1) | state (1) |
| Application suitability |  |  | ◯ | ◯ | ◯ | ◯ | Δ | ◯ |
| Specific gravity |  |  | 3 | 2.93 | 3.03 | 2.29 | 3.07 | 2.06 |
| Thermal conductivity (coefficient of thermal conductivity: W/m · k) |  |  | 3.1 | 2.8 | 3.2 | 2.2 | 2.5 | 1.9 |

TABLE 2

|  |  |  | Sample 7 | Sample 8 | Sample 9 | Sample 10 | Sample 11 |
|---|---|---|---|---|---|---|---|
| Composition | Liquid polymer | Base liquid silicone | 100 | 100 | 100 | 100 | 100 |
|  | Thermally conductive filler small particle diameter (A) | Aluminum hydroxide indefinite form, 1 μm | 112 | — | 50 | 170 | 240 |
|  |  | Alumina, indefinite form 1.6 μm | — | 90 | — | — | — |
|  |  | Alumina, spherical 3 μm | 160 | 170 | 200 | 200 | — |
|  |  | Aluminum hydroxide indefinite form, 8 μm | — | — | — | — | — |
|  | Thermally conductive filler large particle diameter (B) | Alumina, spherical 45 μm | — | — | 400 | — | — |
|  |  | Alumina, spherical 70 μm | 480 | 470 | — | 600 | 120 |
|  |  | Aluminum hydroxide indefinite form, 50 μm | — | — | — | — | — |
|  |  | Boron nitride aggregate, 60 μm | — | 30 | 30 | — | — |
| Ratio by volume of thermally conductive filler ((A)/(B)) |  |  | 0.713 | 0.618 | 0.637 | 0.794 | 3.25 |
| Viscosity (Pa · s) |  |  | 660 | 1470 | 530 | 3170 | 1670 |
| Slump resistance |  |  | state (2) | state (3) | state (2) | state (1) | state (1) |
| Application suitability |  |  | ◯ | ◯ | ◯ | x | ◯ |
| Specific gravity |  |  | 2.9 | 2.91 | 2.9 | 2.98 | 2.29 |
| Thermal conductivity (coefficient of thermal conductivity: W/m · k) |  |  | 2.6 | 2.8 | 2.5 | 3.3 | 1.4 |

State (3): although the form of the curable thermally conductive grease applied was maintained as a whole, slippage occurs at the interface between the aluminum sheet and the curable thermally conductive grease, so that the curable thermally conductive grease slid down while its block form was maintained.

A comparison of samples 3 and 8 having substantially the same viscosity revealed as follows: Sample 3 was in state (1). This was a preferred result. Sample 8 was in state (3) and slid down. Regarding the appearance of Sample 8, a noticeably rough surface was visually observed. The ratio by volume of the thermally conductive fillers, (A)/(B), was 0.618. The proportion of the large-particle-diameter particles was high, so that the particles were seemingly exposed at the surface. In contrast, in sample 3 in which the preferred result was obtained, (A)/(B)=0.658. Samples in which the value of (A)/(B) was more than 0.65 were all in state (1). In view of the slump resistance, the lower limit of the value of (A)/(B) seems to be 0.65.

Comparisons of samples with different viscosities revealed as follows: Sample 2 (viscosity: 860 Pa·s) and sample 6 (viscosity: 700 Pa·s) were in good state (1). In contrast, sample 7 (viscosity: 660 Pa·s) and sample 9 (viscosity: 530 Pa·s) having lower viscosities than those of samples 2 and 6 were in state (2) in which slumps occurred. Samples having higher viscosities than that of sample 6 with a viscosity of 700 Pa·s were all in good state (1). From these results, in view of the slump resistance, the lower limit of the value of the viscosity seems to be 700 Pa·s.

Application Suitability

Regarding application suitability, an application experiment was performed using a dispensing gun with a static mixer having a needle diameter of 6.2 mm. A sample that was able to be applied without any problem was rated as "○". A sample which was able to be applied and in which its discharge velocity was low was rated as "Δ". A sample that was unable to be applied was rated as "x".

The results of the application experiment were as follows: Samples having relatively low viscosities equal to or lower than the viscosity of sample 3 (viscosity: 1710 Pa·s) were rated as "○". Sample 5 (viscosity: 2070 Pa·s) was rated as "Δ". Sample 11 (viscosity: 3170 Pa·s) was rated as "x". These results demonstrate that a grease having a viscosity of 2070 Pa·s or less can be applied and that a grease having a viscosity of 1710 Pa·s or less has preferred application suitability.

Thermal Conductivity

The curable thermally conductive grease preferably has higher thermal conductivity and a thermal conductivity of at least 1.8 W/m·K or more. Thus, a test for thermal conductivity was performed.

Test pieces for the measurement of thermal conductivity were produced, the test pieces being formed of 20-mm-thick cured bodies of the thermally conductive greases of the samples. The thermal conductivity of each of the test pieces was measured by an unsteady-state hot-wire method with a quick thermal conductivity meter QTM-500 manufactured by Kyoto Electronics Manufacturing Co., Ltd.

A comparison of samples 4 and 11 in which the application suitability thereof was rated as "○" and which had almost the same viscosity revealed as follows: Sample 11 had a very low coefficient of thermal conductivity. In sample 4, (A)/(B)=3.02. In sample 11, (A)/(B)=3.25. Thus, an increase in the proportion by volume of the small-particle-diameter thermally conductive filler seemingly reduces the thermal conductivity. From these results, the ratio by volume of the thermally conductive fillers, (A)/(B), is preferably presumed to be 3.02 or less.

Adhesion

Many commonly-used heat-dissipating bodies are composed of aluminum. Many semiconductors are packaged in epoxy resins. Thus, each of the samples was examined for adhesion to aluminum and an epoxy resin.

Each of the samples was applied to a thickness of 100 μm. A tensile lap-shear test specified in JIS K6850 was performed. The adhesion of the curable thermally conductive grease of each sample to aluminum was in the range of 12.5 N/cm² to 16.3 N/cm². The adhesion of the curable thermally conductive grease of each sample to the epoxy resin was in the range of 3.1 N/cm² to 4.8 N/cm². The results demonstrated that each of the samples had sufficient adhesive strength to the heat-generating bodies and the heat-dissipating body.

In this adhesion test, the adhesive strength of each of the samples to aluminum was higher than that to the epoxy resin. Thus, for example, when a structure in which the heat-generating bodies whose surfaces are formed of semiconductor packages composed of an epoxy resin are bonded to the heat-dissipating body composed of aluminum with the thermally conductive grease provided between a corresponding one of the heat-generating bodies and the heat-dissipating body is disassembled, the cured bodies of the curable thermally conductive grease are anticipated to be peeled off at interfaces with the heat-generating bodies and separated with the cured bodies attached to the heat-dissipating body. The heat-dissipating body is easily cleaned, compared with the substrate including many elements other than the heat-generating bodies. It is thus easy to reuse the heat-dissipating body in addition to the reuse of the substrate. Hence, the curable thermally conductive greases of the samples have good repairability.

The foregoing embodiments are illustrative examples of the present invention. The present invention is not limited to these embodiments and includes modifications of forms, materials, production methods, and so forth of members to the extent that the modifications are not inconsistent with the scope of the present invention. For example, while the curable thermally conductive grease is applied to the heat-generating bodies in this specification, the curable thermally conductive grease may be applied to the heat-dissipating body. Furthermore, the curable thermally conductive grease may be applied to the heat-generating bodies and the heat-dissipating body.

REFERENCE SIGNS LIST 1, 1a, 1b, 1c curable thermally conductive grease
2 heat-generating body
3 heat-dissipating body
4 mounting pin
5 heat dissipation structure
6 aluminum sheet
7 test piece
P substrate

The invention claimed is:
1. A curable thermally conductive grease that is provided between a heat-generating body and a heat-dissipating body configured to dissipate heat generated from the heat-generating body to facilitate heat transfer from the heat-generating body to the heat-dissipating body, comprising:

a first agent including
an addition reaction-curable liquid polymer,
a first thermally conductive filler (A) having aluminum hydroxide and an average particle diameter of 0.3 μm to 8 μm, and
a first thermally conductive filler (B) having an average particle diameter of 70 μm to 100 μm,
the ratio by volume of the first thermally conductive filler (A) to the first thermally conductive filler (B), i.e., (A)/(B), being 0.65 to 3.02;
a second agent including
a curing agent of an addition reaction-curable liquid polymer, which is different from the addition reaction-curable liquid polymer of the first agent,
a second thermally conductive filler (A) having aluminum hydroxide and an average particle diameter of 0.3 μm to 8 μm, and
a second thermally conductive filler (B) having an average particle diameter of 70 μm to 100 μm,
the ratio by volume of the second thermally conductive filler (A) to the second thermally conductive filler (B), i.e., (A)/(B), being 0.65 to 3.02, and the curable thermally conductive grease having a viscosity of 700 Pa·s to 2070 Pa·s, at a rotation speed of 1 rpm and a measured temperature of 23° C.,
wherein after the curable thermally conductive grease is applied to the heat-generating body or the heat-dissipating body to a thickness of 5 mm, the curable thermally conductive grease has slump resistance in which the curable thermally conductive grease does not flow down when the heat-generating body or the heat-dissipating body is vertically arranged,
wherein the curable thermally conductive grease has a hardness of E 70 or less after curing in terms of hardness E specified in JIS K6253, and
wherein a solid content included in the curable thermally conductive grease is only
the first thermally conductive filler (A),
the first thermally conductive filler (B),
the second thermally conductive filler (A) and
the second thermally conductive filler (B)
as the solid content other than that derived from the addition reaction-curable liquid polymer and the curing agent of the reaction-curable liquid polymer, and
wherein the first thermally conductive filler (A), the first thermally conductive filler (B), the second thermally conductive filler (A), and the second thermally conductive filler (B) are at least any one of following material selected from the group consisting of
powders of metals,
at least any one of powders of metal oxides selected from the group consisting of aluminum oxide, magnesium oxide, and zinc oxide,
powders of metal nitrides,
powders of metal carbides,
powders of metal hydroxides, and
carbon fibers.

2. A heat dissipation structure for an electronic device, comprising a heat-generating body, heat-dissipating body configured to dissipate heat generated from the heat-generating body, and a curable thermally conductive grease that is provided between the heat-generating body and the heat-dissipating body to facilitate heat transfer from the heat-generating body to the heat-dissipating body,
wherein the curable thermally conductive grease that fills a gap between the heat-generating body and the heat-dissipating body has a thickness of more than 1 mm and 10 mm or less, and
the heat-generating body or the heat-dissipating body is subjected to a compressive stress of 1.0 N/cm² or less from the curable thermally conductive grease, and
the curable thermally conductive grease comprises;
a first agent including
an addition reaction-curable liquid polymer,
a first thermally conductive filler (A) having aluminum hydroxide and an average particle diameter of 0.3 μm to 8 μm, and
a first thermally conductive filler (B) having an average particle diameter of 70 μm to 100 μm,
the ratio by volume of the first thermally conductive filler (A) to the first thermally conductive filler (B), i.e., (A)/(B), being 0.65 to 3.02;
a second agent including
a curing agent of an addition reaction-curable liquid polymer, which is different from the addition reaction-curable liquid polymer of the first agent,
a second thermally conductive filler (A) having aluminum hydroxide and an average particle diameter of 0.3 μm to 8 μm, and
a second thermally conductive filler (B) having an average particle diameter of 70 μm to 100 μm,
the ratio by volume of the second thermally conductive filler (A) to the second thermally conductive filler (B), i.e., (A)/(B), being 0.65 to 3.02, and the curable thermally conductive grease having a viscosity of 700 Pa·s to 2070 Pa·s, at a rotation speed of 1 rpm and a measured temperature of 23° C.,
wherein after the curable thermally conductive grease is applied to the heat-generating body or the heat-dissipating body to a thickness of 5 mm, the curable thermally conductive grease has slump resistance in which the curable thermally conductive grease does not flow down when the heat-generating body or the heat-dissipating body is vertically arranged,
wherein a solid content included in the curable thermally conductive grease is only
the first thermally conductive filler (A),
the first thermally conductive filler (B),
the second thermally conductive filler (A) and
the second thermally conductive filler (B)
as the solid content other than that derived from the addition reaction-curable liquid polymer and the curing agent of the reaction-curable liquid polymer, and
wherein the first thermally conductive filler (A), the first thermally conductive filler (B), the second thermally conductive filler (A), and the second thermally conductive filler (B) are at least any one of following material selected from the group consisting of
powders of metals,
at least any one of powders of metal oxides selected from the group consisting of aluminum oxide, magnesium oxide, and zinc oxide,
powders of metal nitrides,
powders of metal carbides,
powders of metal hydroxides, and
carbon fibers.

3. The heat dissipation structure according to claim 2, wherein in the electronic device including the heat-generating body, the heat-generating body is obliquely arranged with respect to the electronic device.

4. A method for producing a heat dissipation structure for an electronic device, the heat dissipation structure including a heat-generating body, a heat-dissipating body configured to dissipate heat generated from the heat-generating body, and a curable thermally conductive grease that is provided between the heat-generating body and the heat-dissipating body to facilitate heat transfer from the heat-generating body to the heat-dissipating body, the method comprising, in sequence:

applying the curable thermally conductive grease to the heat-generating body or the heat-dissipating body in such a manner that the curable thermally conductive grease provided between the heat-generating body and the heat-dissipating body has a set thickness of more than 1 mm and 10 mm or less and that the curable thermally conductive grease before curing has a larger thickness than the set thickness, wherein the curable thermally conductive grease comprises     a first agent including         an addition reaction-curable liquid polymer,             a first thermally conductive filler (A) having aluminum hydroxide and an average particle diameter of 0.3 µm to 8 µm, and             a first thermally conductive filler (B) having an average particle diameter of 70 µm to 100 µm,         the ratio by volume of the first thermally conductive filler (A) to the first thermally conductive filler (B), i.e., (A)/(B), being 0.65 to 3.02;

a second agent including a curing agent of an addition reaction-curable liquid polymer, which is different from the addition reaction-curable liquid polymer of the first agent,         a second thermally conductive filler (A) having aluminum hydroxide and an average particle diameter of 0.3 µm to 8 µm, and         a second thermally conductive filler (B) having an average particle diameter of 70 µm to 100 µm,             the ratio by volume of the second thermally conductive filler (A) to the second thermally conductive filler (B), i.e., (A)/(B), being 0.65 to 3.02, and the curable thermally conductive grease having a viscosity of 700 Pa·s to 2070 Pa·s, at a rotation speed of 1 rpm and a measured temperature of 23° C.,             and after the curable thermally conductive grease is applied to the heat-generating body or the heat-dissipating body to a thickness of 5 mm, the curable thermally conductive grease has slump resistance in which the curable thermally conductive grease does not flow down when the heat-generating body or the heat-dissipating body is vertically arranged;

pressing the applied curable thermally conductive grease to the set thickness to assemble the heat-generating body and the heat-dissipating body;

curing the curable thermally conductive grease, and wherein a solid content included in the curable thermally conductive grease is only         the first thermally conductive filler (A),         the first thermally conductive filler (B),         the second thermally conductive filler (A) and         the second thermally conductive filler (B)

as the solid content other than that derived from the addition reaction-curable liquid polymer and the curing agent of the reaction-curable liquid polymer, and     wherein the first thermally conductive filler (A), the first thermally conductive filler (B), the second thermally conductive filler (A), and the second thermally conductive filler (B) are at least any one of following material selected from the group consisting of     powders of metals,     at least any one of powders of metal oxides selected from the group consisting of aluminum oxide, magnesium oxide, and zinc oxide,     powders of metal nitrides,     powders of metal carbides,     powders of metal hydroxides, and     carbon fibers.

5. The curable thermally conductive grease according to claim 1, wherein the addition reaction-curable liquid polymer in the first agent and in the second agent is any one of polyurethane, epoxy resins, poly-α-olefins, organopolysiloxanes, and liquid silicone.

6. The curable thermally conductive grease according to claim 5, wherein the liquid silicone in the first agent is organopolysiloxane, and the liquid silicone in the second agent is organohydrogenpolysiloxane.

7. The curable thermally conductive grease according to claim 1, wherein the heat-dissipating body is subjected to a compressive stress of 1.0 N/cm$^2$ or less from the curable thermally conductive grease after curing.

8. The curable thermally conductive grease according to claim 1, wherein an average particle diameter of the first thermally conductive filler (A) and the second thermally conductive filler A are same, an average particle diameter of the first thermally conductive filler (B) and the second thermally conductive filler B are same, and the ratio by volume (A)/(B) of the first thermally conductive filler (A) and the first thermally conductive filler (B) and the ratio by volume (A)/(B) of the second thermally conductive filler (A) and the second thermally conductive filler (B) is same.

9. The heat dissipation structure for an electronic device according to claim 2, wherein the curable thermally conductive grease has a hardness of E 70 or less after curing in terms of hardness E specified in JIS K6253.

10. The heat dissipation structure for an electronic device according to claim 2, wherein the addition reaction-curable liquid polymer in the first agent and in the second agent is any one of polyurethane, epoxy resins, poly-α-olefins, organopolysiloxanes, and liquid silicone.

11. The heat dissipation structure for an electronic device according to claim 10, wherein the liquid silicone in the first agent is organopolysiloxane, and the liquid silicone in the second agent is organohydrogenpolysiloxane.

12. The method for producing a heat dissipation structure for an electronic device according to claim 4, wherein the curable thermally conductive grease has a hardness of E 70 or less after curing in terms of hardness E specified in JIS K6253.

13. The method for producing a heat dissipation structure for an electronic device according to claim 4, wherein the addition reaction-curable liquid polymer in the first agent and in the second agent is any one of polyurethane, epoxy resins, poly-α-olefins, organopolysiloxanes, and liquid silicone.

14. The method for producing a heat disaaipation structure for an electronic device according to claim 4.

15. The method for producing a heat dissipation structure for an electronic device according to claim 4, wherein the heat-dissipating body is subjected to a compressive stress of 1.0 N/cm$^2$ or less from the curable thermally conductive grease after curing.

16. The method for producing a heat dissipation structure for an electronic device according to claim 4, wherein an average particle diameter of the first thermally conductive filler (A) and the second thermally conductive filler (A) are same, an average particle diameter of the first thermally conductive filler (B) and the second thermally conductive filler B are same, and the ratio by volume (A)/(B) of the first thermally conductive filler (A) and the first thermally conductive filler (B) and the ratio by volume (A)/(B) of the second thermally conductive filler (A) and the second thermally conductive filler (B) is same.

17. The curable thermally conductive grease according to claim 1, the heat-generating body is a semiconductor element.

18. The curable thermally conductive grease according to claim 1, the heat-generating body is a machine part.

19. The curable thermally conductive grease according to claim 1, wherein the first thermally conductive filler (B) is at least one of aluminum oxide and aluminum hydroxide.

20. The heat dissipation structure for an electronic device-according to claim 2, wherein the first thermally conductive filler (B) is at least one of aluminum oxide and aluminum hydroxide.

\* \* \* \* \*